(12) United States Patent
Charlebois et al.

(10) Patent No.: US 11,611,193 B2
(45) Date of Patent: Mar. 21, 2023

(54) LOW INDUCTANCE LASER DRIVER PACKAGING USING LEAD-FRAME AND THIN DIELECTRIC LAYER MASK PAD DEFINITION

(71) Applicant: Excelitas Canada, Inc., Vaudreuil-Dorion (CA)

(72) Inventors: Gabriel Charlebois, Vaudreuil-Dorion (CA); JinHan Ju, Kirkland (CA); Lawrence Godfrey, Nanaimo (CA)

(73) Assignee: Excelitas Canada, Inc., Vaudreuil-Dorion (CA)

( * ) Notice: Subject to any disclaimer, the term of this patent is extended or adjusted under 35 U.S.C. 154(b) by 381 days.

(21) Appl. No.: 16/666,714

(22) Filed: Oct. 29, 2019

(65) Prior Publication Data
US 2020/0136347 A1 Apr. 30, 2020

Related U.S. Application Data

(60) Provisional application No. 62/752,460, filed on Oct. 30, 2018.

(51) Int. Cl.
H01S 5/042 (2006.01)
H05K 1/18 (2006.01)
(Continued)

(52) U.S. Cl.
CPC ............ *H01S 5/042* (2013.01); *H01L 23/481* (2013.01); *H01L 23/49589* (2013.01);
(Continued)

(58) Field of Classification Search
CPC ........ H01S 5/042; H01S 5/02345; H01S 5/40; H05K 1/115; H05K 1/181;
(Continued)

(56) References Cited

U.S. PATENT DOCUMENTS 6,649,832 B1   11/2003   Brophy et al.
6,754,407 B2 *  6/2004   Chakravorty ........ H05K 1/0274
                                                    385/32
(Continued)

FOREIGN PATENT DOCUMENTS

DE   102016208431   11/2017
EP    2 738 806      6/2014
(Continued)

OTHER PUBLICATIONS

International Search Report and Written Opinion for PCT/US2019/058445 dated Jan. 23, 2020.
(Continued)

*Primary Examiner* — Donghai D Nguyen
(74) *Attorney, Agent, or Firm* — Wolf, Greenfield & Sacks, P.C.

(57) ABSTRACT

A surface mountable laser driver circuit package is configured to mount on a host printed circuit board (PCB). A surface mount circuit package includes a lead-frame. A plurality of laser driver circuit components is mounted on and in electrical communication with the lead-frame of the surface mount circuit package. A dielectric layer is located between the lead-frame and the host PCB and includes portals through the dielectric layer each arranged to accommodate an electrical connection between the lead-frame and the host PCB. The lead-frame and the dielectric layer are arranged such that a first lead-frame portion and a first dielectric layer portal align with a first end of a host PCB trace configured to provide a current return path for the surface mount laser driver, and a second lead-frame portion and a second dielectric layer portal align with a second end of the host PCB trace.

9 Claims, 7 Drawing Sheets

(51) Int. Cl.
| | |
|---|---|
| *H05K 3/30* | (2006.01) |
| *H01L 23/48* | (2006.01) |
| *H01L 23/495* | (2006.01) |
| *H03K 17/687* | (2006.01) |
| *H05K 1/11* | (2006.01) |
| *H05K 1/16* | (2006.01) |
| *H05K 7/20* | (2006.01) |
| *H01S 5/0231* | (2021.01) |
| *H01S 5/02234* | (2021.01) |
| *H01S 5/02325* | (2021.01) |
| *H01S 5/02345* | (2021.01) |
| *H01S 5/40* | (2006.01) |

(52) U.S. Cl.
CPC ........ *H01S 5/0231* (2021.01); *H01S 5/02234* (2021.01); *H01S 5/02325* (2021.01); *H01S 5/02345* (2021.01); *H03K 17/687* (2013.01); *H05K 1/115* (2013.01); *H05K 1/162* (2013.01); *H05K 1/181* (2013.01); *H05K 3/303* (2013.01); *H05K 7/2039* (2013.01); *H01S 5/40* (2013.01); *H05K 2201/10015* (2013.01); *H05K 2201/10121* (2013.01); *H05K 2201/10166* (2013.01); *H05K 2201/10636* (2013.01); *H05K 2201/10719* (2013.01)

(58) Field of Classification Search
CPC .......... H05K 2201/10121; H05K 2201/10166; H05K 2201/10636; H01L 23/481
USPC .......................................................... 29/832
See application file for complete search history.

(56) References Cited

U.S. PATENT DOCUMENTS

| | | | |
|---|---|---|---|
| 7,400,791 B2 | 7/2008 | Kagaya | |
| 8,040,930 B2* | 10/2011 | Mizusako | H05K 1/181 |
| | | | 372/38.1 |
| 8,447,153 B2 | 5/2013 | Douma et al. | |
| 8,831,061 B2 | 9/2014 | Lauer et al. | |
| 8,882,310 B2 | 11/2014 | Mandelboum et al. | |
| 8,888,331 B2 | 11/2014 | Mandelboum et al. | |
| 9,337,613 B1 | 5/2016 | Lim et al. | |
| 9,509,117 B2 | 11/2016 | Schwarz et al. | |
| 9,722,394 B2 | 8/2017 | Lauer et al. | |
| 9,837,393 B2* | 12/2017 | Standing | H01L 24/16 |
| 9,905,460 B2 | 2/2018 | Chae et al. | |
| 9,960,106 B2 | 5/2018 | Chen et al. | |
| 10,297,980 B2 | 5/2019 | Ryu et al. | |
| 10,459,157 B2* | 10/2019 | Chojnacki | H01S 5/042 |
| 2005/0041934 A1 | 2/2005 | Zama et al. | |
| 2005/0047455 A1* | 3/2005 | Tanaka | G11B 7/126 |
| | | | 372/28 |
| 2007/0014321 A1 | 1/2007 | Shimotsu | |
| 2007/0228535 A1 | 10/2007 | Fujino et al. | |
| 2009/0059981 A1 | 3/2009 | Mizusako | |
| 2009/0135878 A1 | 5/2009 | Yamaguchi et al. | |
| 2009/0321777 A1 | 12/2009 | Mitsuyama et al. | |
| 2013/0195134 A1 | 8/2013 | Okahisa et al. | |
| 2015/0255949 A1 | 9/2015 | Lee et al. | |
| 2016/0268770 A1 | 9/2016 | Tazawa et al. | |
| 2016/0285233 A1 | 9/2016 | Victoria et al. | |
| 2017/0338626 A1 | 11/2017 | Eichler et al. | |
| 2018/0045882 A1 | 2/2018 | Chojnacki et al. | |
| 2018/0145478 A1 | 5/2018 | Sakai et al. | |
| 2018/0254605 A1 | 9/2018 | Wojcik et al. | |
| 2018/0261731 A1 | 9/2018 | Wojcik et al. | |
| 2018/0278017 A1 | 9/2018 | Mignoli et al. | |
| 2018/0366396 A1 | 12/2018 | Komatsu | |
| 2019/0006818 A1 | 1/2019 | Minato et al. | |
| 2019/0019925 A1 | 1/2019 | Morita | |
| 2019/0036299 A1 | 1/2019 | Wojcik et al. | |
| 2019/0067901 A1 | 2/2019 | Khassine et al. | |
| 2019/0115505 A1 | 4/2019 | Tsai et al. | |
| 2019/0146319 A1 | 5/2019 | Stapleton et al. | |
| 2019/0259924 A1 | 8/2019 | Ho et al. | |
| 2019/0260179 A1 | 8/2019 | Ueyama et al. | |

FOREIGN PATENT DOCUMENTS

| | | |
|---|---|---|
| WO | 207198668 | 11/2017 |
| WO | 2018011279 | 1/2018 |
| WO | 2018122013 | 7/2018 |
| WO | 2018188910 | 10/2018 |
| WO | 2018192972 | 10/2018 |
| WO | 2016234068 | 12/2018 |
| WO | 2018234068 | 12/2018 |
| WO | 2019020761 | 1/2019 |

OTHER PUBLICATIONS

International Search Report and Written Opinion for PCT/US2019/0058432 dated Feb. 3, 2020.
International Search Report and Written Opinion for International Application No. PCT/US2019/058436 dated Feb. 2, 2017.
International Preliminary Report on Patentability for International Application No. PCT/US2019/058436 dated Mar. 29, 2018.

* cited by examiner

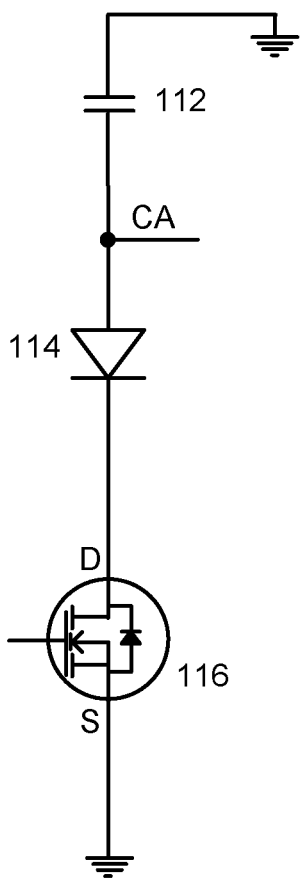 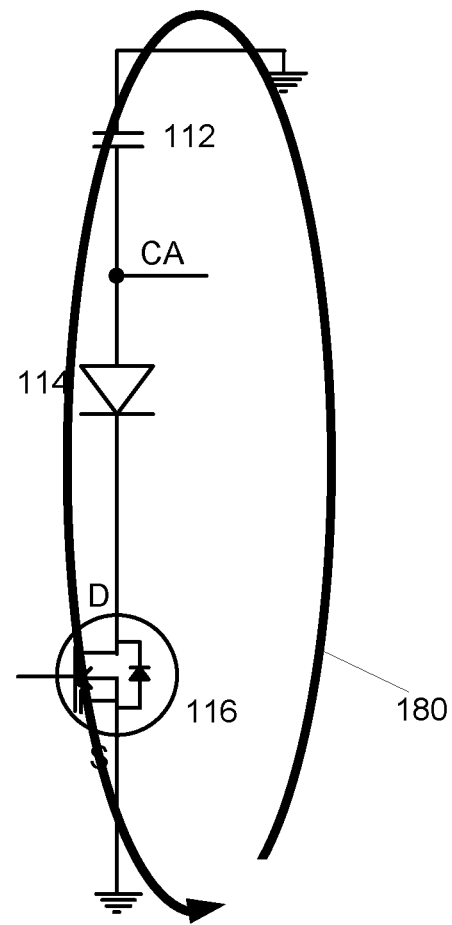
FIG. 1A
(Prior Art)
FIG. 1B
(Prior Art)

LOW INDUCTANCE LASER DRIVER PACKAGING USING LEAD-FRAME AND THIN DIELECTRIC LAYER MASK PAD DEFINITION

CROSS-REFERENCE TO RELATED APPLICATIONS

This application claims the benefit of U.S. Provisional Patent Application Ser. No. 62/752,460, filed Oct. 30, 2018 entitled "High Speed Switching Circuit Configuration," which is incorporated by reference herein in its entirety.

FIELD OF THE INVENTION

The present invention relates to electronic circuitry, and more particularly, is related to packaging for a high speed switching circuit.

BACKGROUND OF THE INVENTION

FIG. 1A shows a basic switching circuit 100 where an electronic switch 116 having a drain D and a source S is connected across a load (or sink 114), to a capacitor 112. The capacitor 112 may be charged via a connection CA. Presently, circuit layouts for such circuits are inadequate for a switching circuit 100 to produce pulses meeting certain specific amplitude and time duration specifications. The physical layout of the circuit elements is essential for fast high current pulses, for example, having a pulse width of a few nanoseconds duration and an amplitude of more than one amp. Incorrect layout, in particular excessive electrical lead line distances between components increases inductance and/or resistance in a current loop 180 shown in FIG. 1B, decreasing the peak levels of current that can flow through the circuit 100 and increasing the pulse width duration. Therefore, there is a need in the industry to address the abovementioned shortcomings.

SUMMARY OF THE INVENTION

Embodiments of the present invention provide low inductance laser driver packaging using a lead-frame and a thin dielectric layer mask pad definition, and a method of producing the same. Briefly described, the present invention is directed to a laser driver circuit package for mounting on a host printed circuit board (PCB). A surface mount circuit package includes a lead-frame. A plurality of laser driver circuit components is mounted on and in electrical communication with the lead-frame of the surface mount circuit package. A dielectric layer is located between the lead-frame and the host PCB including portals through the dielectric layer each arranged to accommodate an electrical connection between the lead-frame and the host PCB. The lead-frame and the dielectric layer are arranged such that a first lead-frame portion and a first dielectric layer portal align with a first end of a host PCB trace configured to provide a current return path for the surface mount laser driver, and a second lead-frame portion and a second dielectric layer portal align with a second end of the host PCB trace.

Other systems, methods and features of the present invention will be or become apparent to one having ordinary skill in the art upon examining the following drawings and detailed description. It is intended that all such additional systems, methods, and features be included in this description, be within the scope of the present invention and protected by the accompanying claims.

BRIEF DESCRIPTION OF THE DRAWINGS

The accompanying drawings are included to provide a further understanding of the invention, and are incorporated in and constitute a part of this specification. The components in the drawings are not necessarily to scale, emphasis instead being placed upon clearly illustrating the principles of the present invention. The drawings illustrate embodiments of the invention and, together with the description, serve to explain the principles of the invention.

FIG. 1A is a circuit diagram of a prior art switching circuit.

FIG. 1B shows the circuit diagram of the prior art switching circuit of FIG. 1A indicating a current loop.

DETAILED DESCRIPTION

Figure 2:
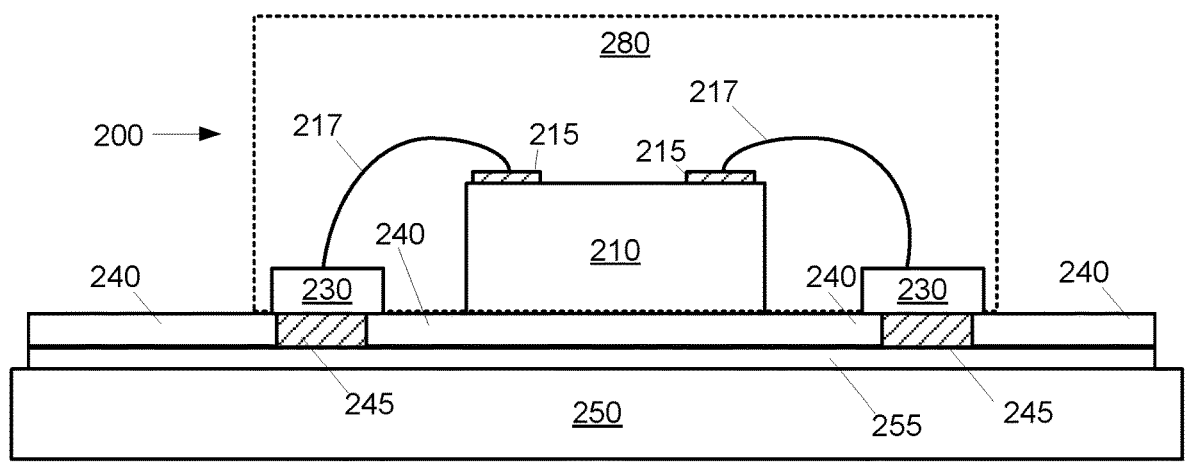
FIG. 2 is a schematic cutaway side view diagram of an integrated circuit in a flat no-leads package mounted to a PCB.

The following definitions are useful for interpreting terms applied to features of the embodiments disclosed herein, and are meant only to define elements within the disclosure.

As used within this disclosure "lead-frame" refers to a metal structure inside a chip package (or just "package") that carries signals from one or more dies inside the chip package to the outside the chip package. Lead-frames are typically manufactured by removing material from a flat plate of copper or copper-alloy. For example, the lead-frame may be formed by etching (generally suitable for high density of leads), or stamping (generally suitable for low density of leads). Lead-frames are used in the manufacture a flat no-leads package, a flat package, or a dual in-line package (DIP).

As used within this disclosure, a "through-hole" or "via" refers to an aperture or opening in a printed circuit board to facilitate electrical communication between components on either side of the printed circuit board. A "portal refers" an aperture or opening in a solder mask and/or dielectric layer to facilitate electrical communication between components on either side thereof.

As used within this disclosure a "flat no-leads package" is a manufactured structure that physically and electrically connects integrated circuits (ICs) to printed circuit boards (PCB). Flat no-leads, also known as micro lead-frame (MLF) and SON (small-outline no leads), is a surface-mount technology, one of several package technologies that connect ICs to the surfaces of PCBs, typically without through-holes. Flat no-lead is a near chip scale plastic encapsulated package made with a planar copper lead-frame substrate. Perimeter lands on the package bottom (the portion adjacent to the PCB when attached) provide electrical connections to the PCB. Flat no-lead packages may include an exposed thermal pad to improve heat transfer out of the IC (into the PCB). Heat transfer can be further facilitated by metal vias in the thermal pad. A single die or multiple dies inside the package is affixed to the lead-frame, for example, glued, and bond wires attach the die pads to the leads. Typically in the last stage of the manufacturing process, the lead-frame is molded in a plastic case, and the outside of the lead-frame is trimmed off, separating all leads. While the embodiments described herein refer to a flat no-leads package, it is to be understood that alternative embodiments may use other packages in a similar fashion, for example a ceramic package.

To differentiate between PCBs within a package and an external PCB that the package is mounted to, the external PCB is referred to herein as the "host PCB," and a PCB within the package is referred to as an "internal PCB." Embodiments of packages described herein may omit an internal PCB.

As used within this disclosure, "vertical" refers to a direction normal to the one or more package PCBs in a package, while "horizontal" refers to a direction parallel to the one or more package PCBs. In general, the package bottom refers to the portion of the package mounted to the mounting surface (typically a PCB external to the package), whereas the package top refers to the portion of the package furthest away from the mounting surface. Directional language (up, down, above, below) is relative to the top (up, above) and bottom (down, below) of the package.

Reference will now be made in detail to embodiments of the present invention, examples of which are illustrated in the accompanying drawings. Wherever possible, the same reference numbers are used in the drawings and the description to refer to the same or like parts.

Typically, a flat no-leads package is used to mount an IC chip to a host PCB. A solder mask, typically a polymer applied on top of metal of the host PCB for protection against oxidation and for preventing solder bridges between solder pads, is interposed between the IC chip and the host PCB and may be used to electrically isolate portions of the IC chip from the host PCB. FIG. 2 is a schematic cutaway side view diagram of an integrated circuit in a flat no-leads package 200 mounted to a host PCB 250. In the flat no-leads package 200, an IC chip 210 is electrically connected to a lead-frame 230 via wire bonds 217 attached to wire bond pads 215 on the IC chip 210. The IC chip 210 and lead-frame 230 are encapsulated in a non-conducting encapsulating material 280, for example plastic. The flat no-leads package 240 is then attached to the host PCB 250, by mounting the flat no-leads package 200 onto a solder mask 240. The solder mask has openings (portals) that may be partially or entirely filled with solder 245, which electrically connects the lead-frame 230 to traces 255 on the host PCB 250.

Loop inductance in a circuit interferes with rapid pulses of a switching component, for example, a laser in a LIDAR application. Therefore, it is desirable to arrange the circuit components in the package with minimal lead run distances therebetween. Short lead run distances may be accomplished, for example, by stacking layers of components rather than using a co-planar arrangement of the circuit components.

Figures 3, 4:
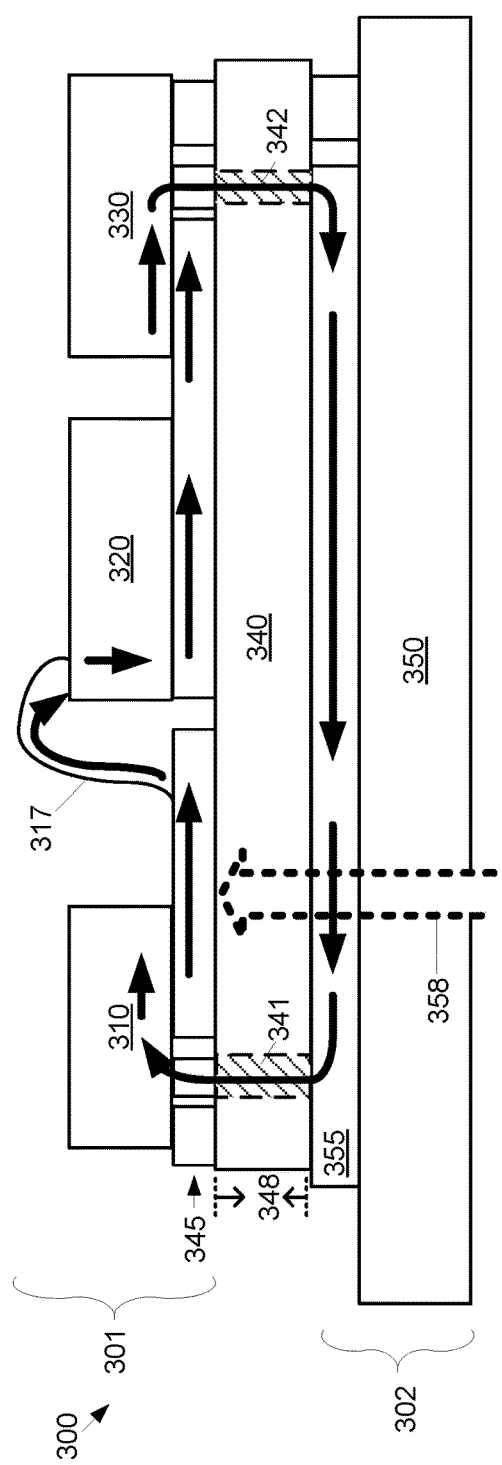
FIG. 3 shows the functional behavior of a low inductance laser driver packaging using stacked PCBs.
FIG. 4 is a schematic diagram of a first exemplary embodiment of a stacked circuit using a lead-frame and solder mask.

FIG. 3 shows the functional behavior of a low inductance laser driver 300 using stacked PCBs 340, 350. Here circuit components for the laser driver 300, for example a storage capacitor 310, a laser diode 320 and a switch 330, are mounted atop a first layer PCB 340.

The first layer PCB traces 345, the components 310, 320, 330, and one or more wire bonds 317 conduct current in a first layer 301 of the laser driver circuit 300. The laser driver circuit 300 includes a return path for the current for the laser driver circuit 300 to behave properly, so at least a second layer 302 of the laser driver circuit 300, here a second layer PCB 350, is used. The second layer PCB 350 has second layer traces 355 conduct current in the second layer 302 of the circuit. The current passes between the first layer PCB traces 345 and the second layer PCB traces 355 using conducting material in through hole vias 341, 342 disposed through the first layer PCB 340. A circuit loop (shown by dark arrows) passes upward from the second layer PCB trace 355 through a first via 341 to the first layer PCB trace 345 and to the storage capacitor 310. From the storage capacitor 310, the current loop proceeds through a separate section of the first layer PCB trace 345 through the wire bonds 317 to the laser diode 320. After passing through the laser diode 320, the current loop proceeds through a third section of the first layer PCB trace 345 to a switch, typically a GaN field effect transistor (FET) or Silicon metal-oxide-semiconductor field-effect transistor (MOSFET) 330. The current loop then proceeds downward through the second via 342 through the first layer PCB 340 to the second layer PCB trace 355. The dotted arrow represents a bias voltage 358 applied to the capacitor 310 prior to a discharge. The bias voltage 358 is provided by a slow non-critical path applied through an internal via (not shown) in the laser driver circuit 300.

While stacking components may reduce the length of lateral leads and/or traces in the plane of a PCB, the length of vertical inter-layer electrical connections (for example, vias, wire leads, solder, and metal traces) may still contribute unwanted inductance to the laser driver circuit 300. For example, the thickness 348 of the first layer PCB 340 may be on the order of 50 to 200 μm.

FIG. 4 is a schematic diagram of a first exemplary embodiment of a stacked circuit 400 using a lead-frame 445 and a solder mask 440 instead of an internal PCB 340 to reduce layer vertical thickness in comparison with the stacked PCBs 340, 350 (FIG. 3). Here, the first circuit components for the laser driver are the same as shown in FIG. 3, (the storage capacitor 310, the laser diode 320, the switch 330, and one or more wire bonds 317) but here are packaged, for example, in a flat no-leads package 405 or LGA package and mounted to a lead-frame 445 of the flat no-leads package 405. The lead-frame conductive layer 445 thickness may be in the range of 50-80 preferably around 65 The flat no-leads package 405 may be sealed with an encapsulation 480, for example with a plastic encapsulation material. The components in the flat no-leads package 405 make up a first (top) layer 401 of the stacked circuit 400. The flat no-leads package 405 may not include an internal PCB.

The flat no-leads package 405 is mounted on a substrate, for example a host PCB 450, with a thin dielectric layer 440, for example, a solder mask 440 typically on the order of 20 to 30 μm thick providing electrical isolation between the lead-frame 445 and the PCB 450. The solder mask 440 has openings (or portals) to provide desired electrical connection between portions of the lead-frame 445 and electrical traces 455 on the PCB 450. For example, portions of the lead-frame 445 may be electrically connected to the PCB traces 455 using solder points 441, 442 located in openings in the solder mask 440

The laser driver 400 incorporates a return path for the current so that the circuit 400 behaves properly, so at least a second layer 402 is used, here the PCB 450 and PCB traces 455. The PCB traces 455 conduct current in the second layer 402 of the circuit. The current passes upward between the PCB traces 455 of the second layer 402 and the lead-frame 445 of the first layer 401 by solder points 441, 442 through openings in the solder mask 440. The circuit loop (shown by dark arrows) passes upward from the PCB trace 455 through a first solder point 441 disposed in a first hole in the solder mask 440 to the lead-frame 445 and to the storage capacitor 310. From the storage capacitor 310, the current loop proceeds through a separate section of the lead-frame 445 through the wire bonds 317 to the laser diode 320. From the laser diode 320, the current loop proceeds through a third section of the lead-frame 445 to the switch 330. The current loop then passes downward through the second solder point 442 through a second opening in the solder mask 440 to the second layer PCB trace 355. The dotted arrow represents a bias voltage 358 applied to the capacitor 310 prior to a discharge. bias voltage 358 is a slow non-critical path applied through an opening (not shown) in the solder mask in FIG. 4.

Figure 6:
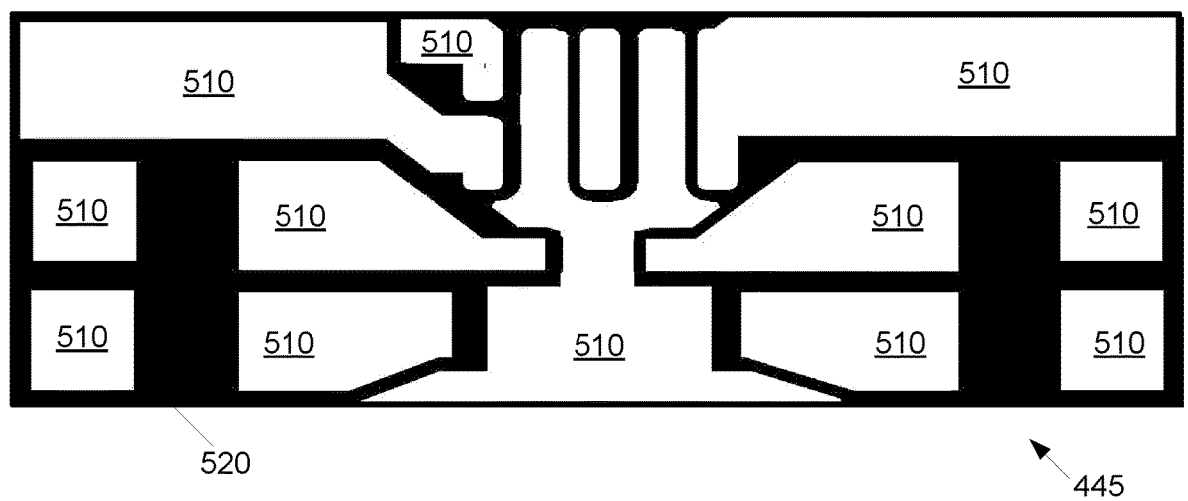
FIG. 6 shows an example of a lead-frame under the first embodiment shown FIG. 4.

FIG. 6 shows an example of the lead-frame 445, showing pads 510 of conducting metal, such as copper, deposited upon a non-conducting substrate 520. The pads 510 may be arranged to provide electrical connections with the circuit components 310, 320, 330 (FIG. 4) and the PCB traces 455 (FIG. 4).

Figure 7:
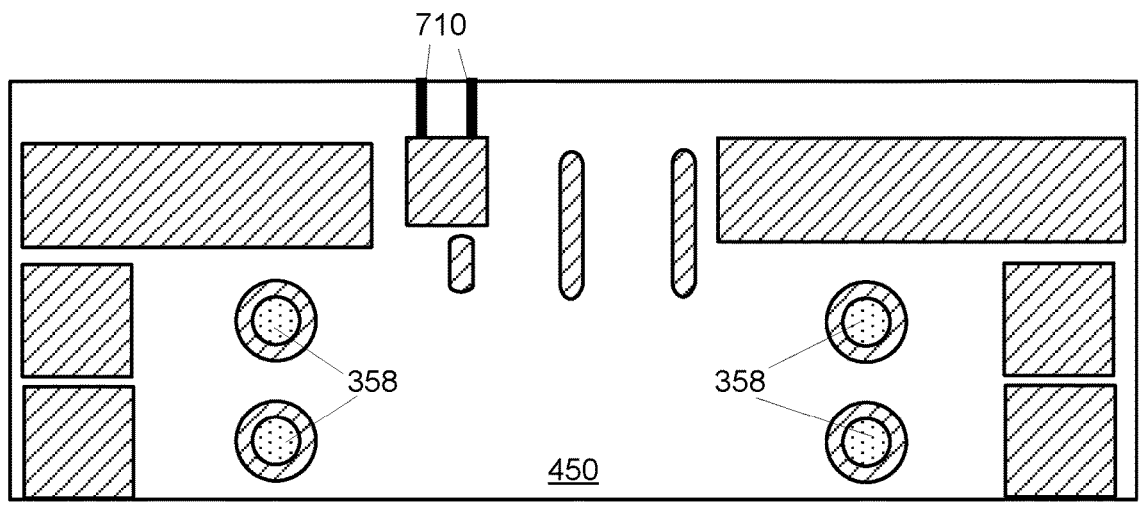
FIG. 7 shows an example of a solder mask layout under the first embodiment shown in FIG. 4.

FIG. 7 shows an example of a solder mask layout 700 used to complete the circuit 400 (FIG. 4). This layout 700 may be superimposed over the conductive layer 455 shown in FIG. 4. The non-shaded area in FIG. 7 indicates the PCB 450 outer layer 455 of the second layer 402 (FIG. 4) (note, the individual traces 455 (FIG. 4) are not shown here for clarity). The hashed areas represent the openings in the solder mask 440 (FIG. 4). The openings in the solder mask 440 (FIG. 4) allow for most of the center portion of the circuit 400 (FIG. 4) to be isolated from the ground layer below. The four dotted inner circles indicate areas supplying the bias voltage 358 to the circuit 400 (FIG. 4), for example, from a third layer (not shown) below the PCB 450 (FIG. 4). A gate line 710 is used to conduct a signal to trigger the switch 330 (FIG. 4).

Figure 8:
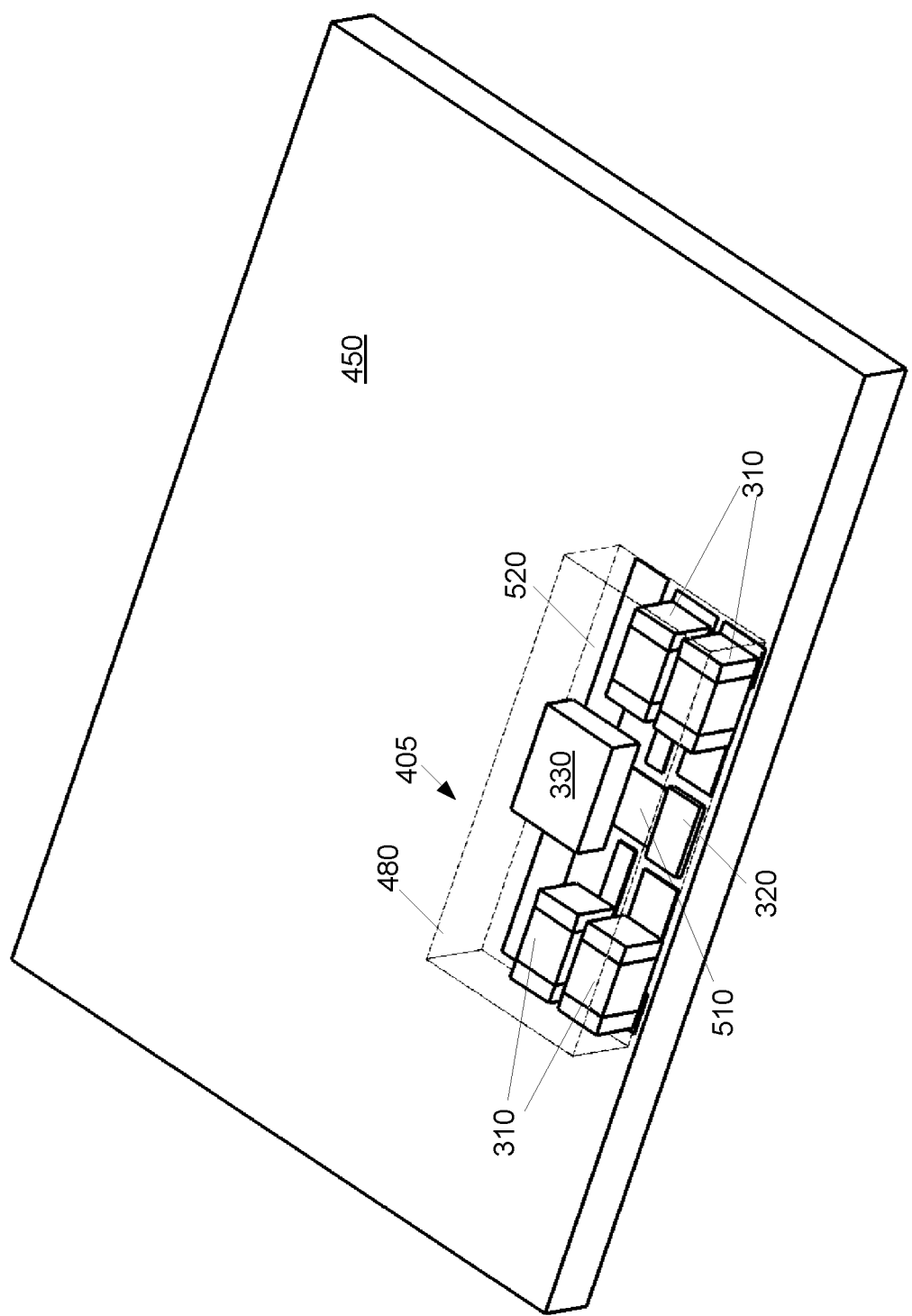
FIG. 8 is a schematic three-dimensional drawing of the assembled circuit under the first embodiment shown in FIG. 4.

FIG. 8 is a perspective drawing of the assembled circuit 400.

Figure 5:
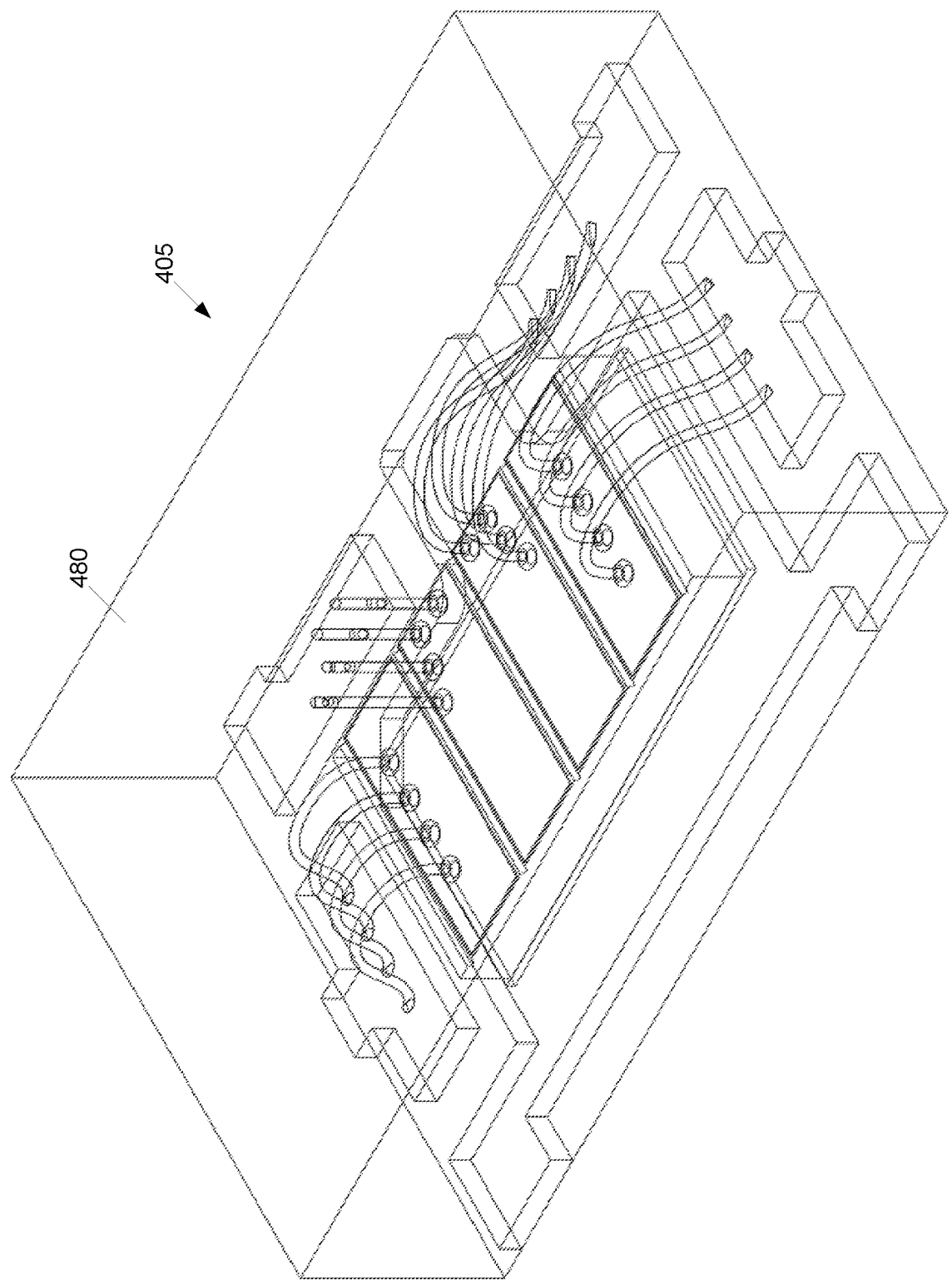
FIG. 5 is a perspective three-dimensional drawing of the flat no-leads package under the first embodiment shown in FIG. 4.

Returning to FIG. 4, the second layer 402 is preferably arranged to be as close as possible to the first layer 401 to help reduce component inductance for the circuit 400. For example, reduced inductance is needed to produce a short duration, high power pulse (for example, a pulse having a pulse width of a few nanoseconds duration and an amplitude of more than one amp) from the laser diode 320 without excessive voltages. Loop inductance below is 1 nH desirable for optimal performance. For example, loop inductance for the arrangement shown in FIG. 3 may be on the order of 1.3 nH. While FIG. 4 shows a low inductance configuration applied to the first embodiment having a single element laser diode 320, alternative embodiments may employ this arrangement for other configurations, for example, a laser diode array, as shown by FIG. 5. While the embodiments described here are directed to laser driver circuits, alternative embodiments may employ this low inductance circuit arrangement for other types of circuits where low loop inductance is desirable, for example, fast switching circuits.

The solder mask 440 may be a dielectric layer formed directly upon the bottom of the flat no-leads package 405 adjacent to the lead frame 445, or directly upon the PCB 450. The solder mask 440 dielectric layer may be formed, for example, by printing or otherwise depositing a dielectric material upon the flat no-leads package 405 and/or the PCB 450. Alternatively, the solder mask 440 dielectric layer may be formed separately from the flat no-leads package 405 and the PCB 450 and attached, for example, when the flat no-leads package 405 is soldered to the PCB 450.

The manufacturing of the first embodiment stacked circuit 400 has many advantages over using stacked PCBs, as shown in FIG. 3. Besides reducing the inductance of the circuit 400, forming the lead-frame 445 and solder mask 440 is simpler and faster to produce than using two layers of PCBs and forming through vias 341, 342 (FIG. 3). For example, the stacked circuit 400 may use standard PCB manufacturing processes instead of chip-on-board assembly. Use of the lead frame 445 allows for a testable component, allowing for assembly using known good parts. Further, using a package having a single PCB instead of two PCB reduces cost, and allows efficient use of readily available and present material on the PCB. The embodiments may use un-common and hard to procure PCB pre-preg (insulator between the copper). For example, a very thin (2 mil) pre-preg layer may be used in the PCB build for the layer 340. This approaches current industry limits, as few manufacturers use such thin material.

It should be noted that the thickness of the layers and circuit components depicted in FIGS. 3 and 4 are not proportional, and are merely intended to clarify the current path. While embodiments describe herein generally refer to a solder mask, other thin dielectric layers such as a polyimide film used in the making of ceramic or organic (FR4) substrates may be used instead.

Figure 9:
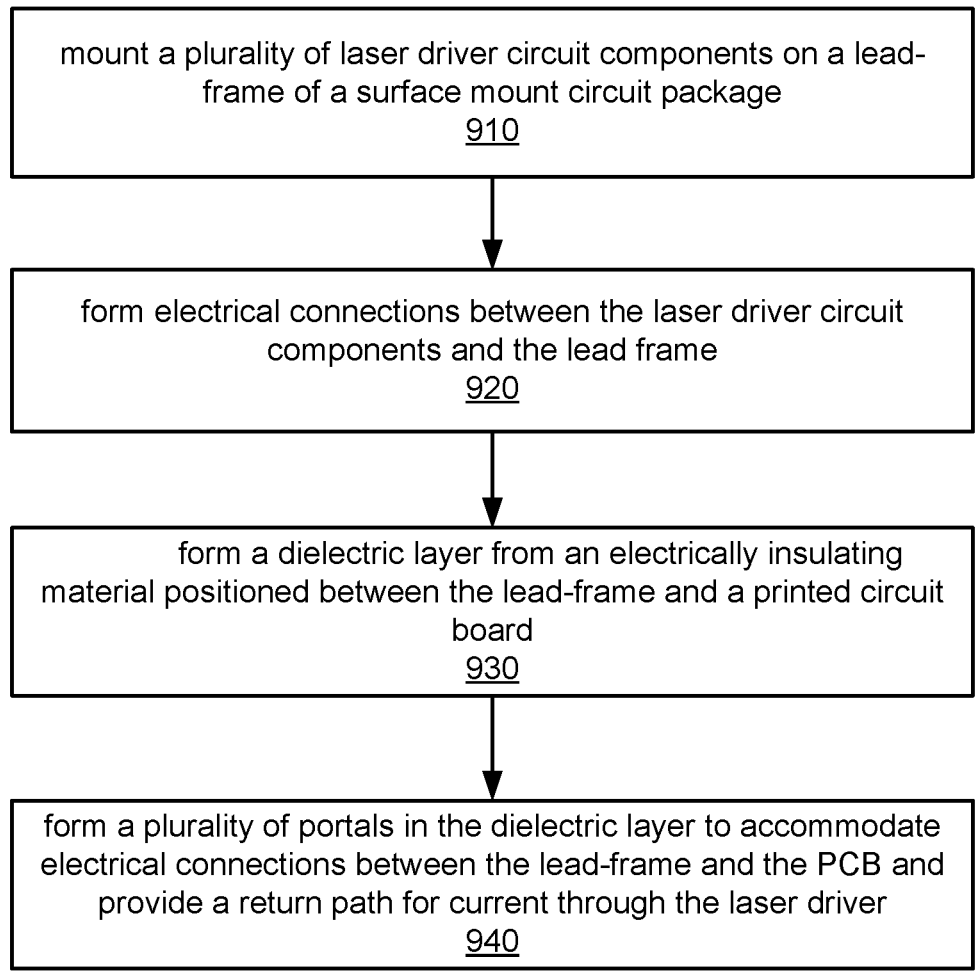
FIG. 9 is a flowchart of an exemplary embodiment of a method for forming a low inductance laser driver package.

FIG. 9 is a flowchart 900 of an exemplary embodiment of a method for forming a low inductance laser driver package. It should be noted that any process descriptions or blocks in flowcharts should be understood as representing modules, segments, portions of code, or steps that include one or more instructions for implementing specific logical functions in the process, and alternative implementations are included within the scope of the present invention in which functions may be executed out of order from that shown or discussed, including substantially concurrently or in reverse order, depending on the functionality involved, as would be understood by those reasonably skilled in the art of the present invention. The method shown in FIG. 9 is described with reference to elements shown in FIG. 4.

A plurality of laser driver circuit components 310, 320, 330 are mounted to a lead-frame 445 of a surface mount circuit package 405, as shown by block 910. Electrical connections are formed between the laser driver circuit components 310, 320, 330 and the lead frame 445, as shown by block 920. A dielectric layer 440 of an electrically insulating material to be positioned between the lead-frame 445 and a printed circuit board 450 is formed, as shown by block 930. A plurality of portals is formed in the dielectric layer 440 to accommodate electrical connections between the lead-frame 445 and the printed circuit board 450, shown by block 940. The portals are preferably arranged to provide a return path for current through the laser driver circuit components 310, 320, 330.

It will be apparent to those skilled in the art that various modifications and variations can be made to the structure of the present invention without departing from the scope or spirit of the invention. In view of the foregoing, it is intended that the present invention cover modifications and variations of this invention provided they fall within the scope of the following claims and their equivalents.

What is claimed is:

1. A surface mountable laser driver circuit package configured to mount on a host printed circuit board (PCB), comprising:
   a surface mount circuit package comprising:
   a lead-frame; and
   a plurality of laser driver circuit components mounted on and in electrical communication with the lead-frame; and
   a dielectric layer disposed between the lead-frame and the host PCB, the dielectric layer comprising a plurality of portals through the dielectric layer each arranged to accommodate an electrical connection between the lead-frame and the host PCB,
   wherein the lead-frame and the dielectric layer are arranged such that a first lead-frame portion and a first dielectric layer portal are disposed over a first portion of a host PCB trace, a second lead-frame portion and a second dielectric layer portal are disposed over a second portion of the host PCB trace, and the host PCB trace is configured to provide a current return path for the surface mount circuit package.

2. The surface mountable laser driver circuit package of claim 1, wherein the dielectric layer comprises a solder mask.

3. The surface mountable laser driver circuit package of claim 1, wherein the dielectric layer has a thickness in the range of 10 µm to 50 µm.

4. The surface mountable laser driver circuit package of claim 1, wherein the surface mount circuit package comprises a flat no-leads package.

5. The surface mountable laser driver circuit package of claim 1, wherein the surface mount circuit package comprises a ceramic package.

6. The surface mountable laser driver circuit package of claim 1, further comprising at least one wire bond disposed between the lead-frame and a first circuit component of the plurality of laser driver circuit components.

7. The surface mountable laser driver circuit package of claim 1, further comprising an encapsulation material configured to encapsulate the plurality of laser driver circuit components upon the surface mount circuit package.

8. The surface mountable laser driver circuit package of claim 1, wherein the plurality of laser driver circuit components comprises a laser diode, a capacitor, and a switch.

9. The surface mountable laser driver circuit package of claim 1, wherein the surface mountable laser driver circuit package does not include an internal PCB.

* * * * *